United States Patent
Preti et al.

(10) Patent No.: US 6,991,420 B2
(45) Date of Patent: Jan. 31, 2006

(54) TOOL FOR HANDLING WAFERS AND EPITAXIAL GROWTH STATION

(75) Inventors: Franco Preti, Milan (IT); Vincenzo Ogliari, Capergnanica (IT)

(73) Assignee: LPE SpA, Milan (IT)

( * ) Notice: Subject to any disclaimer, the term of this patent is extended or adjusted under 35 U.S.C. 154(b) by 0 days.

(21) Appl. No.: 10/813,748

(22) Filed: Mar. 26, 2004

(65) Prior Publication Data

US 2004/0191029 A1    Sep. 30, 2004

Related U.S. Application Data

(63) Continuation of application No. PCT/EP02/10598, filed on Sep. 20, 2002.

(30) Foreign Application Priority Data

Sep. 27, 2001    (IT)    .................... MI2001A2014

(51) Int. Cl.
*B65G 49/07*    (2006.01)

(52) U.S. Cl. .................... 414/744.8; 414/941; 294/64.1

(58) Field of Classification Search ............. 414/744.8, 414/752.1, 941; 294/64.1, 64.2
See application file for complete search history.

(56) References Cited

U.S. PATENT DOCUMENTS

| | | | | |
|---|---|---|---|---|
| 4,009,785 A | * | 3/1977 | Trayes | ........................ 414/676 |
| 4,707,012 A | * | 11/1987 | Takagi | ........................ 294/64.1 |
| 4,856,766 A | * | 8/1989 | Huberts | ........................ 269/21 |
| 5,188,501 A | * | 2/1993 | Tomita et al. | ......... 414/416.08 |
| 6,043,458 A | * | 3/2000 | Fortune | ........................ 219/230 |
| 6,099,056 A | * | 8/2000 | Siniaguine et al. | ........ 294/64.3 |
| 6,102,788 A | | 8/2000 | Uto | |
| 6,254,155 B1 | * | 7/2001 | Kassir | ........................ 294/64.1 |
| 6,398,621 B1 | * | 6/2002 | Zuniga et al. | ................. 451/8 |
| 6,638,004 B2 | * | 10/2003 | Berger et al. | ............... 414/800 |
| 2003/0014158 A1 | * | 1/2003 | Berger et al. | ............... 700/218 |

FOREIGN PATENT DOCUMENTS

EP    1 022 615 A1    7/2000
WO    WO 00/48234    12/1999

* cited by examiner

*Primary Examiner*—James W. Keenan
(74) *Attorney, Agent, or Firm*—Katten Muchin Rosenman LLP

(57) ABSTRACT

A tool (7) for handling a semiconductor material wafer (100) is designed to be used in an epitaxial growth station; the tool (7) comprises a disk (20) having an upper side (21) and a lower side (22), the lower side (22) being so shaped as to get in contact with the wafer (100) only along its edge (103); the disk (20) is provided internally with a suction chamber (24) that is in communication with the outside of the disk (20) through one or more suction holes (25) and in communication with a suction duct of an arm of a robot through a suction port (26); the disk (20) entirely covers the wafer (100) and the suction holes (25) open to the lower side (22) of the disk (20), whereby, when the wafer (100) is in contact with the lower side (22) of the disk (20), it can be held by the tool (7) through suction.

19 Claims, 4 Drawing Sheets

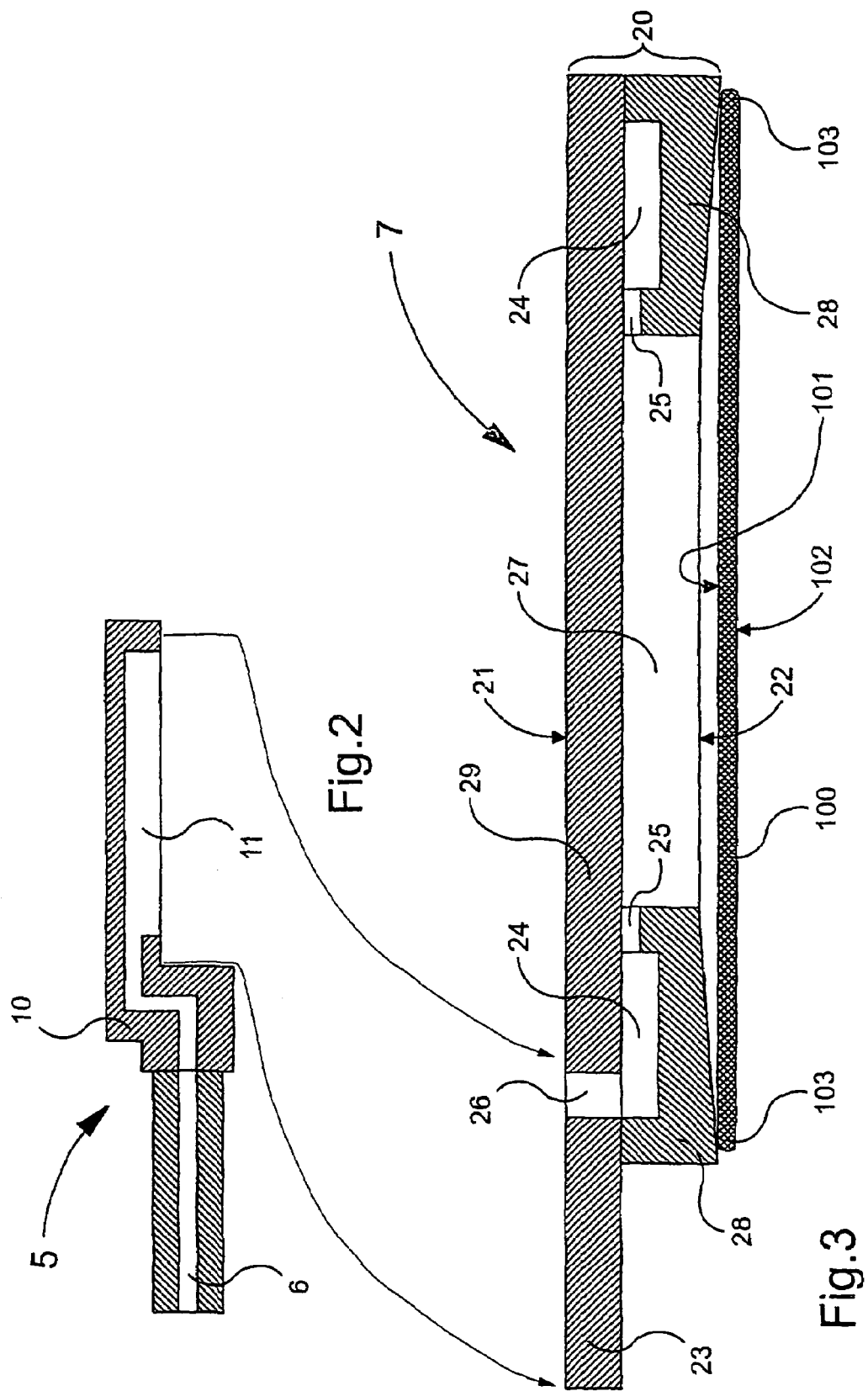

Figure 1:
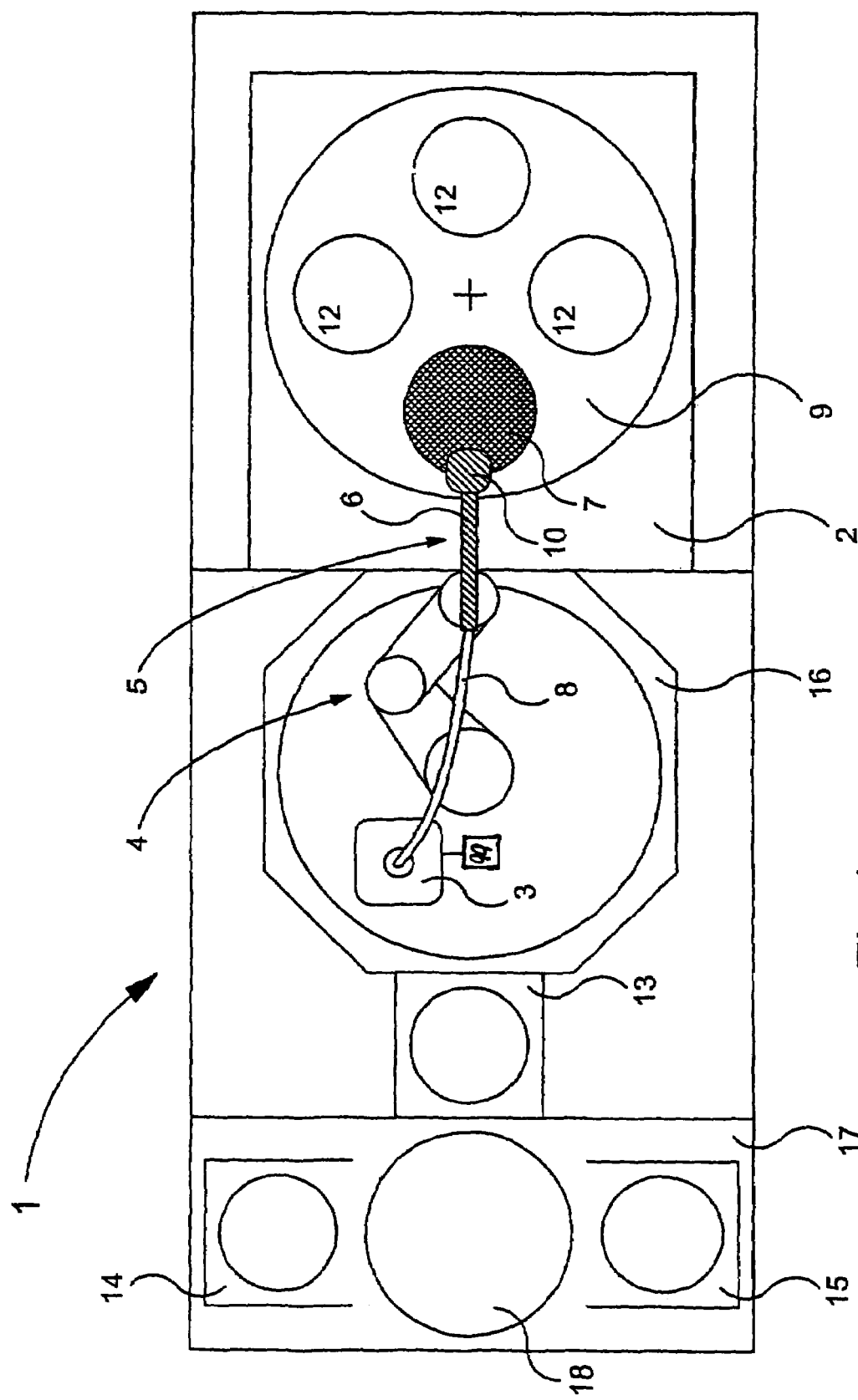

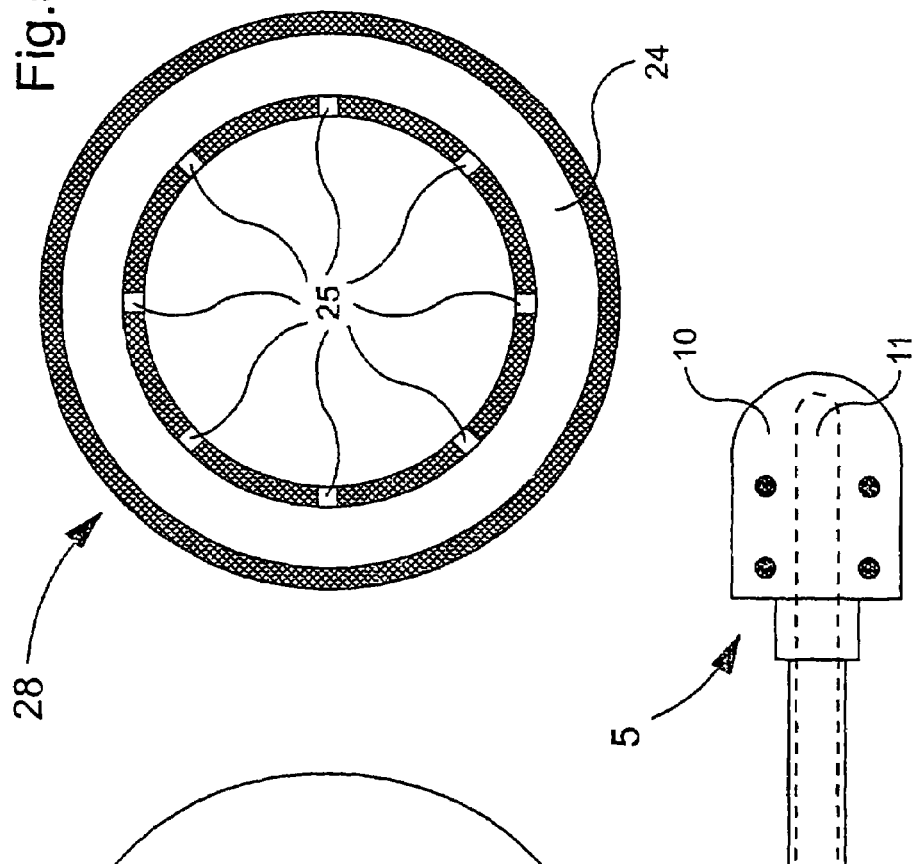
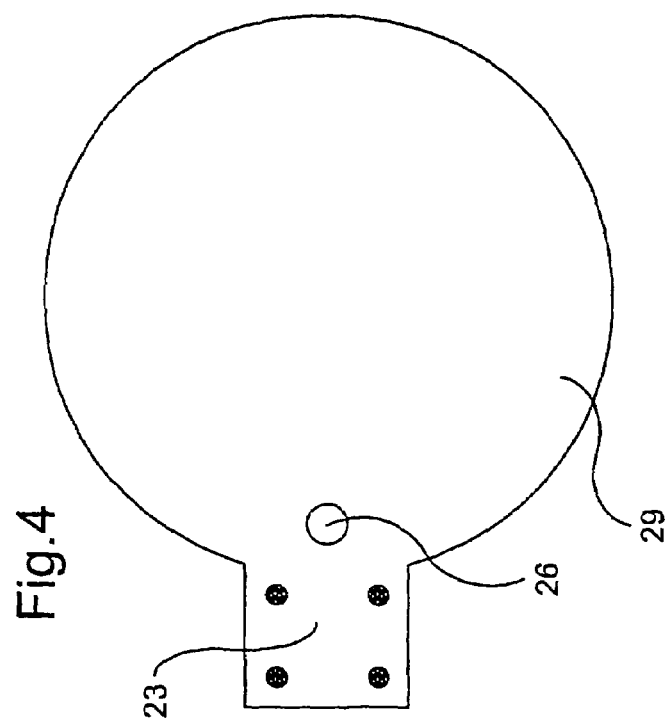
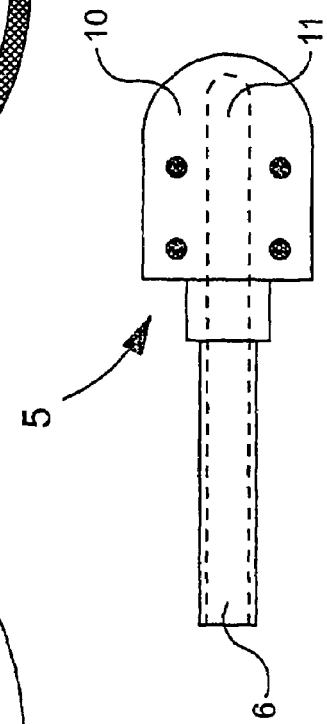

TOOL FOR HANDLING WAFERS AND EPITAXIAL GROWTH STATION

CROSS-REFERENCE TO RELATED APPLICATION

The present application is a continuation of and claims priority under 35 USC § 120 from International PCT Application No. PCT/EP02/10598 filed on Sep. 20, 2002 and claims priority under 35 USC § 119 from Italian Patent Application Number MI2001A002014 filed on Sep. 27, 2001.

The present invention relates to a tool for handling a wafer, particularly a semiconductor material wafer, according to the preamble of claim 1, and to an epitaxial growth station using the same.

In a plant for manufacturing semiconductor integrated circuits (chips), the handling of wafers is a very important item; in fact, it is necessary to avoid that, by handling the wafers, such damages are produced to their structure or to their surfaces as to cause operating defects in the resulting integrated circuits.

In general, the wafers are made of semiconductor material but, sometimes, substrates are used in the form of an isolating material slice.

The wafers have a front side and a back side; the front side is the side of the wafer where the structures are formed that realize the integrated circuit; therefore, it is particularly important not to cause damages to such surface of the wafer; in practice, it is necessary that such surface does not get in contact with anything. Additionally, the wafer has an edge, in general rounded, that extends for some millimeters both on its back and on its front. The edge surface is not used for realizing integrated circuits and, therefore, it may get in contact, if necessary, with tools but always with great care.

In general, it is preferred to handle the wafer through its back.

Unfortunately, during some wafer treatment phases, this is not possible, for example in the epitaxial reactors.

In this case, it is necessary to use the edge; clearly, this implies considerable difficulties.

From patent application WO 00/48234 (of the same applicant as the present patent application), it is known a device for handling wafers and it is also known an epitaxial growth station that uses it with advantage; such a patent application represents a useful source of information relating to the subject of the present invention and it is herein incorporated by reference.

In the abovementioned patent application there is described a robot for the automatic insertion/extraction of wafers into/from the reaction chamber of the station, with an arm provided with a suction duct connected to a suction system, at one end of which a tool is applied for handling a wafer.

The tool comprises a circular disk with a large central hole, having an upper side and a lower side; the lower side is so shaped as to get in contact with the wafer only along the edge of the wafer; the disk is provided internally with a suction chamber having the shape of a cylindrical ring; the suction chamber is in communication with the outside of the disk through suction holes and with the suction duct through a suction port; the suction holes open to the lower side of the disk.

When the wafer is in contact with the lower side of the disk and the suction system is active, the wafer is held by the tool through suction.

Such a tool allows to handle the wafers well, without causing damages; additionally, as suction is applied only next to the contact area between the tool and the wafer, the wafer undergoes no appreciable deformation.

Anyway, with this tool the suction holes cause not only suction of the wafer but also considerable suction of the gasses of the atmosphere surrounding the wafer due to the presence in the disk of the large central hole. Such additional suction requires a suitable oversize of the suction system, particularly with respect to the electrical power and to the use of special materials in the suction system due to such an atmosphere.

If the solution is considered of simply closing the large central hole, there would not be atmosphere suction any longer, but there would be the risk that suction would cause defective deformations to the wafer held by the tool; such risk would be greater during the phase of extracting the wafer from the reaction chamber when this is still considerable hot (hundreds of Celsius degrees).

Therefore, it is the object of the present invention to provide an alternative tool that allows to handle the wafers well and without damaging them, particularly without deforming them with defective effects, and with lower requirements for the suction system.

Such object is substantially achieved through the tool for handling of the present invention.

According to a further aspect, the present invention relates also to a station for epitaxial growth treatments, wherein such tool finds an advantageous application.

Further advantageous aspects of the present invention are set out in the dependent claims.

The basic idea of the present invention is to use a disk without central hole so that no appreciable atmosphere suction takes place.

With this new conformation of the tool, suction reveals more effective and, therefore, it is possible to reduce it considerably; in such a tool, a reduced suction corresponds to a limited pressure depression applied to the handled wafer and, therefore, to small deformations of the same; additionally, it has been checked that such small deformations are neither permanent nor causing appreciable damages to the structure or to the surfaces of the wafer.

Figure 8:
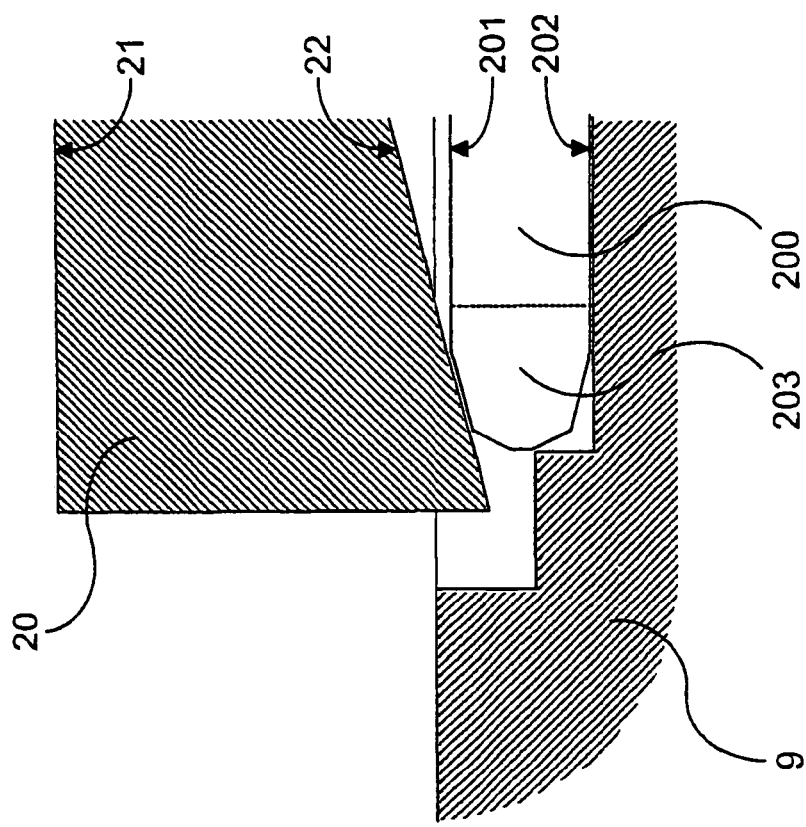
Figure 7:
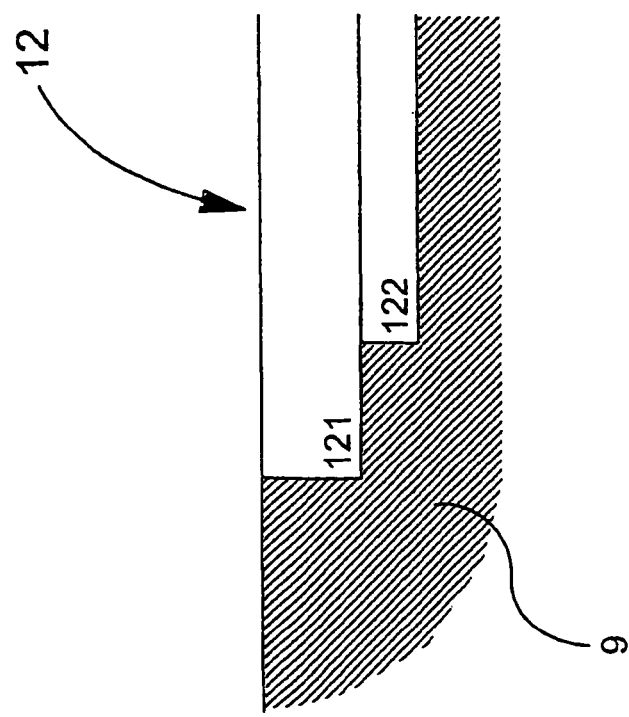

The invention will become more apparent from the following description to be considered in conjunction with the accompanying drawings, wherein:

FIG. 1 shows a station for epitaxial growth treatments according to the present invention, FIG. 2 shows the cross-section of the end part of the robot arm of the station of FIG. 1, FIG. 3 shows the cross-section of a tool according to the present invention in contact with a semiconductor material wafer, FIG. 4 shows the top view of the tool of FIG. 3, FIG. 5 shows the top view of a component part of the tool of FIG. 3, namely the shell, FIG. 6 shows the top view of the end part of the robot arm of FIG. 2, FIG. 7 shows a partial cross-section of a pocket of the susceptor of the station of FIG. 1, and FIG. 8 shows the same cross-section of FIG. 7, when there is a semiconductor material wafer and a when tool according to the present invention is going to pick it up.

With reference to FIG. 1, a station 1 for epitaxial growth treatments of wafers comprises, in general, a reaction chamber 2, a transfer chamber 16, a scrubbing chamber 13, a storage area 17.

Inside storage area 17 there is usually a first cassette 14 containing the wafers still to be treated and a second cassette 15 containing the wafers already treated in the station.

An external robot 18, shown only in a very schematic way in FIG. 1, provides, before the treatment, to extract the wafers one by one from cassette 14 and to insert them into scrubbing chamber 13, and, after the treatment, to extract the wafers one by one from scrubbing chamber 13 and to insert them into cassette 15. Inside transfer chamber 16, an internal robot 4 is located that provides, before the treatment, to extract the wafers one by one from scrubbing chamber 13 and to insert them into reaction chamber 2, and, after the treatment, to extract the wafers one by one from reaction chamber 2 and to insert them into scrubbing chamber 13.

Inside reaction chamber 2, a support 9 for the wafers to be treated is located that is usually called "susceptor" in the reactors heated by induction.

In general, support 9 is able to receive a certain number of wafers, depending also on their diameter; such diameter may reach nowadays twelve inches, i.e. about thirty centimeters, but, in the microelectronic industry, there is a trend to use larger and larger wafers.

The wafers are seated in pockets 12 formed on the surface of support 9. Support 9 is, in general, rotatable, so that robot 4 can place the various wafers in the various pockets always through the same movement.

In order to perform the required movements, robot 4 comprises various arms suitably articulated between each other; on a final arm 5 of robot 4 a tool 7 is applied adapted to handle the wafers one by one.

In a station according to the present invention, as the one shown in FIG. 1, arm 5 essentially consists of a rigid tube 6 that also acts as suction duct. Tube 6 is connected, on one side, to a suction system 3 through a flexible tube 8. On the other side, at its end, tube 6 is joined to a plate 10 in order to facilitate the application of tool 7, as will be made clearer in the following.

Making now reference to FIG. 3, FIG. 4, FIG. 5, tool 7 according to the present invention is useful for handling a wafer 100 in an epitaxial growth station. Wafer 100 has a front 101, a back 102 and an edge 103.

Tool 7 is adapted to be applied to arm 5 (of internal robot 4) provided with suction duct 6 connected to suction system 3.

Tool 7, according to the present invention, comprises a disk 20 having an upper side 21 and a lower side 22; lower side 22 is so shaped as to get in contact with wafer 100 only along edge 103 of the wafer; disk 20 is provided internally with a suction chamber 24 that is in communication with the outside of disk 20 through one or more suction holes 25 (in the embodiment shown in the figures these holes are eight) and that is adapted to be put in communication with suction duct 6 through a suction port 26.

In tool 7, disk 20 is such as to entirely cover wafer 100 and suction holes 25 open to lower side 22 of disk 20, whereby, when wafer 100 is in contact with lower side 22 of disk 20 and suction system 3 is active, wafer 100 is held by tool 7 through suction.

Naturally, chamber 24 may take various shapes, for example, cylinder, toroid, cylindrical ring, star, branched; in fact, it has substantially the function of connecting holes 25 to port 26; according to a particularly simplified embodiment of the present invention, tool 7 is provided with only one suction hole and suction chamber 24 substantially simply consists of a suction passageway internal to disk 20 and connecting hole 25 to port 26.

With this new conformation of the tool, suction reveals more effective and, therefore, it is possible to reduce it considerably; in such a tool, a reduced suction corresponds to a limited pressure depression applied to the handled wafer and, therefore, to small deformations of the same; additionally, it has been checked that such small deformations are neither permanent nor causing appreciable damages to the structure or to the surfaces of the wafer.

Such a tool is particularly suitable for being used in epitaxial growth stations with a disk-shaped susceptor as, in these stations, the tool (and also the wafer) is always in a horizontal position; therefore, suction is extremely effective in holding the wafer as its action directly opposes to the weight of the wafer.

In order to have a uniform and stable action on wafer 100, it is advantageous to provide at disk 20, on its lower side 22, in its central part, a suction cavity 27; in this case, it would be a good thing that suction holes 25 open to lower side 22 of disk 20 into suction cavity 27.

For simplicity of construction of disk 20, and for ease of application of tool 7 to arm 5, it is advantageous that port 26 opens to upper side 21 of disk 20.

In order to facilitate the application of disk 20 to arm 5 of robot 4, disk 20 may be provided with a plate 23; in this case, port 26 opens to or next to plate 23; typically, plate 23 will be fixed to the corresponding plate of arm 5, for example, through screws.

The realization of such a disk always implies great difficulties; in fact, it is made of quartz and it needs to be made in such a way as to operate and withstand very hard conditions, as those of an epitaxial reactor.

In a constructively advantageous embodiment, disk 20 comprises a shell 28, having outline being substantially ring-shaped and cross-section being substantially U-shaped, and a lid 29, being substantially flat and being substantially circle-shaped, joined to shell 28 in such a way as to form a closed chamber 24 corresponding to the suction chamber and a cavity 27 being substantially cylinder-shaped and corresponding to the suction cavity; shell 28 is so shaped as to get in contact with wafer 100 only along edge 103 of the wafer. In this embodiment, suction holes 25 open to the lateral walls of cylinder-shaped cavity 27.

Still in this embodiment, it is constructively advantageous that suction holes 25 consist of grooves made on the inner lip of shell 28 at the border with lid 29. Still in this embodiment, it is constructively advantageous that, if disk 20 is provided with plate 23, this plate is part of lid 29 and suction port 26 opens to or next to plate 23.

Making now reference to FIG. 1, station 1, according to the present invention, for epitaxial growth treatments of wafers, particularly semiconductor material wafers, must comprise a reaction chamber 2, a suction system 3 and a robot 4 for the automatic insertion/extraction of wafers into/from reaction chamber 2; robot 4 must be provided with an arm 5 having a suction duct 6 connected to suction system 3; additionally, it must comprise a tool 7, of the type described above, provided with a suction chamber 24 and adapted to handle a wafer 100; tool 7 must be applied to arm 5 of robot 4 and suction chamber 24 must be in communication with suction duct 6.

An epitaxial growth station with disk-shaped susceptor, would use a tool of the type described above with particular advantage, as already explained.

As already said, with this new conformation of the tool, suction reveals more effective on the wafer; therefore, it is possible to use a limited suction with beneficial effects on the suction system 3.

The reduction in the amount of sucked reaction chamber atmosphere also leads to beneficial effects on the suction system 3.

If arm 5 of robot 4 essentially consists of a tube, tube 6, this may act at the same time both as support of tool 7 and as suction duct.

Advantageously, arm 5 of robot 4 comprises a plate 10, joined to one end of tube 6, adapted to be applied to tool 7, and provided with an internal duct 11 that puts tube 6 of arm 5 in communication with suction port 26 of disk 20; this may be better understood making reference to FIG. 2 and FIG. 6.

Particularly, if the tool is provided with an own plate, plate 10 of arm 5 is applied to corresponding plate 23 of tool 7 (for example through screws).

In order to use at best the tool according to the present invention, at least a part of the lateral area of edge 103 of wafer 100 must be accessible to the tool. In scrubbing chamber 13 this is normal. On the contrary, in reaction chamber 2, wafers are normally sunk into pockets 12 of support 9 and, therefore, the tool should get in contact with support 9, which is a drawback.

It could be thought to realize pockets 12 with a depth smaller than the wafers to be treated but, if part of the edge of the wafer is not masked by the edge of the pocket, during treatment, this will be subject to a considerable heat loss causing crystallographic defects from the wafer edge, such as "slip-lines" and "dislocations".

With reference to FIG. 7 and FIG. 8, an advantageous solution to this problem consists in providing that pocket 12 of support 9, adapted to seat wafers 200 to be treated, consist of a first cavity 121 and a second cavity 122 formed within first cavity 121 and having a substantially flat bottom and having a shape and a size corresponding to the wafer to be treated.

As can be seen, particularly, in FIG. 8, disk 20 touches wafer 200 at its edge 203 without touching front 201, back 202, and even support 9; additionally, edge 203 of wafer 200 is completely masked by the edge of pocket 12.

The depth of second cavity 122 is preferably smaller than the width of wafer 200 to be treated; as on the market there exist wafers of even quite different width, in this case, a "universal" support has to take the most thick wafer into account. The overall depth of first cavity 121 and of second cavity 122 is preferably larger than the width of wafer 200 to be treated; as on the market there exist wafers of even quite different width, in this case, a "universal" support has to take the most thick wafer into account.

Naturally, when determining the size of cavity 121 and cavity 122 it is necessary to take into account not only all the possible shapes and sizes of the wafers to be treated but also the shape and size of lower side 22 of disk 20 of tool 7.

At the light of the problem to avoid, as much as possible, deformations in the wafers, it is advantageous to provide that suction system 3 be adapted to realize a suction that depends on the wafer handling phase, in such a way as to apply to the handled wafer, for example, always only the minimum necessary pressure depression.

For example, if the station is provided with an inlet area for wafers to be treated, corresponding to scrubbing chamber 13, an outlet area for wafers already treated, still corresponding to scrubbing chamber 13, and a treatment area, corresponding to reaction chamber 2, it is advantageous that suction system 3 be adapted to realize:

a suction of a first value during a phase of transferring a wafer from the inlet area to the treatment area and during a phase of transferring a wafer from the treatment area to the outlet area, a suction of a second value during a phase of picking up a wafer from the inlet area, a suction of a third value during a phase of picking up a wafer from the treatment area;

wherein the third value is bigger than the second value and the second value is bigger than the first value.

According to a less sophisticated solution, only two suction values may be used: one for loading the wafers into the reactor and one for unloading the wafers from the reactor.

This may be justified because during the picking phase there is always a capture action during which inertias are won. Additionally, during the picking phase of a hot wafer from a susceptor, there is a certain adhesion between the wafer and the susceptor.

Naturally, anyway, it is important that suction system 3 be adapted to cause such a pressure depression in the space between disk 20 and handled wafer 100 as to cause no damage to the structure or to the surfaces of handled wafer 100. In the present invention, the pressure depression considered is in the range between few millibars to few tens of millibars.

The control of the suction generated by suction system 3 may be an open-loop control or a closed-loop control.

Suction system 3 may be of the type based on a pump with vacuum regulator in which the vacuum may be programmed, for example, by a computer.

At the light of the limited flow rate required from suction system 3, this may advantageously be of the type operating by Venturi effect, i.e. of the type based on the pressure depression generated next to a narrowing when a fluid flows; in this case, the system may advantageously be fed with a flow of inert gas.

In this case, if variable suction is desired, suction system 3 may advantageously comprise a Mass Flow Controller 99 programmable, for example, by a computer sending "set points"; such controller controls the flow of inert gas and, as a consequence, the generated pressure depression.

What is claimed is:

1. Tool for handling a wafer in an epitaxial growth station, the tool being adapted to be applied to an arm of a robot for the automatic insertion/extraction of wafers into/from the reaction chamber of the station, the arm being provided with a suction duct connected to a suction system, the tool comprising: a disk having an upper side and a lower side, the lower side being so shaped as to get in contact with the wafer only along the edge of the wafer, the disk being provided internally with a suction chamber that is in communication with the outside of the disk through suction holes and that is adapted to be put is in communication with the suction duct through a suction port, the disk entirely covering the wafer, wherein when the wafer is in contact with the lower side of the disk and the suction system is active, the wafer is held by the tool through suction and wherein the disk, on its lower side in its central part, is provided with a suction cavity, and wherein the suction holes are open to the lower side of the disk into the suction cavity.

2. Tool according to claim 1 wherein the suction port opens to the upper side of the disk.

3. Tool according to claim 1, wherein the disk comprises a shell, having an outline being substantially ring-shaped and a cross-section being substantially U-shaped, and a lid, being substantially flat and being substantially circle-shaped, joined to the shell in such a way as to form a closed chamber corresponding to the suction chamber and a cavity being substantially cylinder-shaped and corresponding to the suction cavity, and wherein the shell is so shaped as to get in contact with the wafer only along the edge of the wafer.

4. Tool according to claim 3, wherein the suction holes open to the lateral walls of the cylinder-shaped cavity.

5. Tool according to claim 3, wherein the suction holes consist of grooves made on the inner lip of the shell at the border with the lid.

6. Tool according o claim 3, wherein the lid is provided with a plate for applying the tool to the arm of the robot, and wherein the suction port opens to or next to the plate.

7. Tool according to claim 1, wherein the disk is provided with a plate for applying the tool to the arm of the robot, and wherein the suction port opens to or next to the plate.

8. Tool according to claim 1, wherein the suction holes open laterally into the suction cavity.

9. Station for epitaxial growth treatment of wafers, comprising a reaction chamber, a suction system and a robot for the automatic insertion/extraction of wafers into/from the reaction chamber, the robot being provided with an arm having a suction duet connected to the suction system, characterized in that it comprises a tool, the tool being adapted to be applied to the arm of the robot for the automatic insertion/extraction of wafers into/from the reaction chamber of the station, the tool comprising: a disk having an upper side and a lower side, the lower side being so shaped as to get in contact with the wafer only along the edge of the wafer, the disk being provided internally with a suction chamber that is in communication with the outside of the disk through suction holes and that is adapted to be put in communication with the suction duct through a suction port, the disk entirely covering the wafer, wherein when the wafer is in contact with the lower side of the disk and the suction system is active, the wafer is held by the tool through suction and wherein the disk, on its lower side in its central part, is provided with a suction cavity, and wherein the suction holes are open to the lower side of the disk into the suction cavity.

10. Station according to claim 9, wherein the reaction chamber is of the type with a disk-shaped susceptor.

11. Station according to claim 9 wherein the arm of the robot essentially consists of a tube that also acts as a suction duct.

12. Station according to claim 11, wherein the arm of the robot comprises a plate, joined to one end of the tube, adapted to be applied to the tool, and provided with an internal duct that puts the tube of the arm in communication with the suction port of the disk.

13. Station according to claim 9, wherein the reaction chamber houses a support that is provided with at least one pocket for seating a wafer to be treated in the station, the pocket consisting of a first cavity and a second cavity formed within the first cavity and having a substantially flat bottom and having a shape and a size corresponding to the wafer to be treated.

14. Station according to claim 13, wherein the depth of the second cavity is smaller than the width of the wafer to be treated.

15. Station according to claim 13, wherein the overall depth of the first cavity of the second cavity is larger than the width of the wafer to he treated.

16. Station according to claim 9, wherein the suction system is adapted to realize a suction that depends on the wafer handling phase.

17. Station according to claim 16, comprising an inlet area for wafers to be treated, an outlet area for wafers already treated, and a treatment area, wherein the suction system is adapted to realize:
   a suction of a first value during a phase of transferring a wafer from the inlet area to the treatment area and during a phase of transferring a wafer from the treatment area to the outlet area,
   a suction of a second value during a phase of picking up a wafer from the inlet area,
   a suction of a third value during a phase of picking up a wafer from the treatment area, and wherein the third value is bigger than the second value and the second value is bigger than the first value.

18. Station according to claim 9, wherein the suction system is adapted to cause such at pressure depression in the space between the disk and the handled wafer as to cause no damage to the structure or to the surfaces of the handled wafer.

19. Station according to claim 9, wherein the suction system comprises a programmable Mass Flow Controller for controlling the flow of an inert gas.

* * * * *